(12) United States Patent
Hatakeyama

(10) Patent No.: US 7,208,773 B2
(45) Date of Patent: Apr. 24, 2007

(54) CAP FOR SEMICONDUCTOR DEVICE

(75) Inventor: Yasushi Hatakeyama, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 11/216,404

(22) Filed: Aug. 31, 2005

(65) Prior Publication Data

US 2006/0043404 A1    Mar. 2, 2006

(30) Foreign Application Priority Data

Sep. 2, 2004    (JP) ............................. 2004-255092

(51) Int. Cl.
*H01L 29/22*    (2006.01)
*H01L 33/00*    (2006.01)
(52) U.S. Cl. ............ 257/99; 257/E33.058; 257/E33.07; 257/433; 257/704; 257/680
(58) Field of Classification Search .................... None
See application file for complete search history.

(56) References Cited

U.S. PATENT DOCUMENTS

2002/0051848 A1* 5/2002 Li ........................... 427/376.6
2003/0039573 A1* 2/2003 Sherman et al. ............... 419/47
2004/0195580 A1* 10/2004 Nishizawa et al. ........... 257/99
2004/0207314 A1* 10/2004 Aitken et al. ................ 313/504
2004/0217455 A1* 11/2004 Shiono et al. .............. 257/678

FOREIGN PATENT DOCUMENTS

JP          6-005990       1/1994
JP          2003-034549    2/2003

* cited by examiner

*Primary Examiner*—Sue A. Purvis
*Assistant Examiner*—Leslie Pilar Cruz
(74) *Attorney, Agent, or Firm*—Rankin, Hill, Porter & Clark LLP

(57) ABSTRACT

In a cap for a semiconductor device in which a light transmissive window is fixed to a cap body provided with a light transmissive opening using low-melting glass as a fixing material so that the light transmissive window covers the light transmissive opening, the low-melting glass is leadless vanadate-series low-melting glass, and the light transmissive window is fixed to the cap body through an eutectic alloy layer formed by an eutectic reaction of vanadium contained in the low-melting glass and metal applied on the surface of the cap body.

20 Claims, 2 Drawing Sheets

CAP FOR SEMICONDUCTOR DEVICE

BACKGROUND OF THE INVENTION

1. Technical Field

This invention relates to a cap for a semiconductor device, which is employed for assembling a semiconductor laser device used in e.g. an optical disk recording/reproducing apparatus, and more particularly to a cap for a semiconductor device in which light-transmissive member is fixed to a cap body using leadless low-melting glass.

2. Related Art

As a semiconductor laser device, the configuration as shown in FIG. 5 is known. This semiconductor laser device includes a disk-shaped metallic stem 1, a semiconductor laser element 2 serving as a light source, and a monitoring element 4 such as a PIN photodiode. The semiconductor laser element 2 is located on the side wall of a metallic block (heat sink) provided upright on the disk-shaped metallic stem 1. The monitoring element 4 is located below the semiconductor laser element 2 for monitoring the output from the semiconductor laser element 2. Lead pins 6 are passed through through-holes 5 which penetrates the metallic stem 1 and glass-sealed therein. The lead pins 6 are electrically connected to the semiconductor laser element 2 and monitoring element 4 through bonding wires 8, respectively. Incidentally, one of the lead pins 6 is welded on the lower surface of the metallic stem 1 as a lead pin for grounding.

The semiconductor laser device is manufactured by hermetically fixing a cap for a semiconductor device 10 (hereinafter also simply referred to as a semiconductor device cap) to an element loading surface of the metallic stem 1 with the semiconductor laser element 2 and other loaded thereon. A cap body 12 is formed in a cap shape to have a light transmissive opening 12a at the end face by press-working a metallic member. And the semiconductor device cap 10 is formed by fixing a light transmissive window 14 of a glass plate so as to seal or cover the light transmissive opening 12a from the inside of the cap body 12. The cap body 12 is fixed to the metallic stem 1 by welding its flange to the edge of the metallic stem 1 (see JP-A-6-5990).

There are several methods of fixing the light transmissive window 14 to the cap body 12. One of them is to heat the cap body 12 in the air to form an oxide film on the surface thereof, fix the light transmissive window 14 through low-melting glass using the oxide film, remove the unnecessary oxide film of the surface of the cap body 12 and thereafter plate the cap body 12 with a corrosion-resistant plating such as a nickel plating, thus completing the product. Another method is to plate the surface of the cap body 12 with nickel, and form an Ni—Pb eutectic alloy layer during fixing owing to an eutectic reaction of a lead component (Pb) contained in the low-melting glass and nickel in the nickel plating at the interface between the low-melting glass and nickel plating so that the light transmissive window 14 is fixed to the cap body 12.

According to the latter method, the plating step after the light transmissive window 14 has been fixed to the cap body 12 is not required. The low-melting glass is not eroded by a plating solution. The step of removing the oxide film is not also required. Thus, this method provides an advantage of simplifying the manufacturing process.

FIG. 4 is an enlarged view of the configuration in which the light transmissive window 14 is fixed to the cap body 12 using the eutectic reaction between nickel and Pb contained in the low-melting glass. At the interface between a nickel plating 18 formed on the surface of the cap body 12 (metal) and low-melting glass 16, an Ni—Pb eutectic alloy layer 20 due to the eutectic reaction between the Pb component contained in the low-melting glass and Ni in the nickel plating is formed.

Meanwhile, in recent years, a method for manufacturing an optical device using the low-melting glass not containing the lead component has been proposed from the viewpoint of environmental protection. For example, there is a method of manufacturing the semiconductor device cap using $SnO-P_2O_5$ series glass containing no lead as a fixing glass for fixing the light transmissive window (see JP-A-2003-34549).

As described above, in a process of manufacturing the semiconductor device cap, containment of no lead has been realized by the method using the $SnO-P_2O_5$ series glass. However, where the $SnO-P_2O_5$ series glass is used as the low-melting glass, as compared with the case of using Pb-series low-melting glass employed in the related art, the $SnO-P_2O_5$ series glass is problematic in hermeticiy and endurance. This lead to a problem being incapable of giving sufficient reliability for the semiconductor device cap which requires high hemeticity and endurance.

SUMMARY OF THE INVENTION

An object of this invention is to provide a reliable cap for a semiconductor device which realizes containment of no lead in a manufacturing process using low-melting glass containing no lead as a fixing material for fixing a light transmissive member to a cap body and can give high hermeticity and humidity resistance required for a semiconductor laser device or an optical device.

However, the present invention need not achieve the above objects, and other objects not described herein may also be achieved. Further, the invention may achieve no disclosed objects without affecting the scope of the invention.

In order to attain the above object, the cap for a semiconductor device according to this invention has the following configuration.

The cap for a semiconductor device in which a light transmissive member is fixed to a cap body provided with a light transmissive opening using low-melting glass as a fixing material so that the light transmissive member covers the light transmissive opening is characterized in that the low-melting glass is leadless vanadate-series low-melting glass, and the light transmissive member is fixed to the cap body through an eutectic alloy layer formed by an eutectic reaction of vanadium (V) contained in the low-melting glass and metal applied on the surface of the cap body.

Incidentally, the vanadate-series low-melting glass refers to low-melting glass containing vanadium (V) as a main component (containing vanadium of 20 weight % or more on an oxide (vanadium oxide) basis), and in this invention it refers to leadless glass containing no lead component. Further, the low-melting glass refers to glass having a lower melting point than that of light transmissive member and a characteristic permitting the light transmissive member to be fixed at a heating temperature at which the light transmissive member is not molten. For fixing of the light transmissive member, the low-melting glass which is molten at 500° C. or so is used. For this reason, as the metal applied on the surface of the cap body by using a known deposition technique such as plating, used is the metal which creates an eutectic alloy with vanadium (V) contained in the low-melting glass at a fixing temperature or lower when the light transmissive member is fixed.

A product is preferably employed in which the metal applied on the surface of the cap body is palladium (Pd), and the light transmissive member is fixed to the cap body through an eutectic alloy layer formed by the eutectic reaction of vanadium (V) contained in the low-melting glass and palladium (Pd) applied on the surface of the cap body.

Another product is preferably employed in which the metal applied on the surface of the cap body is gold (Au), and the light transmissive member is fixed to the cap body through an eutectic alloy layer formed by the eutectic reaction of vanadium (V) contained in the low-melting glass and gold (Au) applied on the surface of the cap body.

The semiconductor device cap according to this invention realizes no containment of lead in a manufacturing process of the semiconductor device cap by fixing the light transmissive member to the cap body using leadless vanadate-series low-melting glass as the fixing material. Thus, it is provided as the cap for a semiconductor device which does not adversely affect the environment. Where the low-melting glass is molten to fix the light transmissive member to the cap body, the light transmissive member is fixed to the cap body through the eutectic alloy layer created by the eutectic reaction of vanadium (V) contained in the low-melting glass and the metal applied on the surface of the cap body, thereby providing the cap for a semiconductor device in which the light transmissive member is strongly fixed to the cap body and sufficient fixing strength and excellent hermeticity and humidity resistance are given.

DETAILED DESCRIPTION OF THE INVENTION

Now referring to the attached drawings, an explanation will be given of embodiments of this invention.

Embodiment 1

Figure 1:
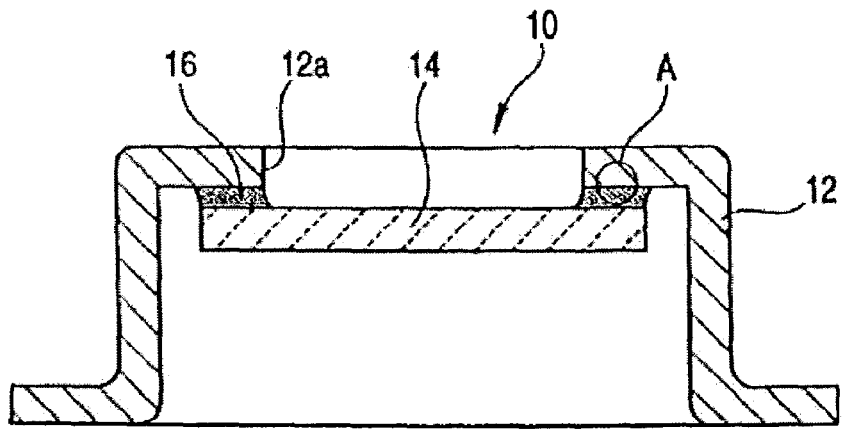
FIG. 1 is an explanation view showing the non-limiting configuration of the cap for a semiconductor device.

FIG. 1 is a sectional view showing the configuration of a semiconductor device cap 10 according to this invention. In this semiconductor device cap 10, a light transmissive window (light transmissive member) 14 is fixed to a cap body 12 using leadless low-melting glass 16 as a fixing material. The cap body 12 is formed in a cap shape having a flange at an opening edge by press-working a metallic material. At the upper part, a light transmissive opening 12a is formed. The light transmissive window 14 which is made of soft glass and disk-shaped is fixed to the edge of the light transmissive opening 12a so as to cover the light transmissive opening 12a by a low-melting glass 16 from the inside of the cap body 12. Incidentally, the material of the cap body 12 is not particularly limited, and may be e.g. iron, iron-nickel alloy, iron-cobalt-nickel alloy or alloy containing copper or nickel as a main component.

The features of the semiconductor device cap 10 according to this embodiment are as follows. First, as a fixing material for fixing the light transmissive window 14 to the cap body 12, in place of lead-series low-melting glass employed in the related art, leadless vanadate low-melting glass is employed.

Secondly, with metal such as palladium or gold being applied on the surface of the cap body 12, which causes an eutectic reaction with vanadium (V) contained in the vanadate series low-melting glass employed as the fixing material at the temperature of fixing the light transmissive window 14, in fixing the light transmissive window 14 to the cap body 12 by melting the low-melting glass, an eutectic alloy layer of the metal applied on the surface of the cap body 12 and vanadium contained in the low-melting glass is formed at the interface between the cap body 12 and the low-melting glass 16, thereby fixing the light transmissive window 14.

The metal applied on the surface of the cap body 12 to form the eutectic alloy layer with vanadium, e.g. palladium or gold may have a thickness necessary to cause the eutectic reaction. In applying the metal causing the eutectic reaction with vanadium to the surface of the cap body 12 by plating, after underlying plating for protecting the cap body 12 such as nickel plating is performed, required plating such as palladium plating may be performed.

An explanation will be given of an example of manufacturing the semiconductor device cap by using the vanadate-series low-melting glass as the fixing material and applying palladium as metal causing the eutectic reaction with vanadium on the surface of the cap body 12.

The vanadate-series low-melting glass can have various compositions. In this embodiment, the vanadate-series low-melting glass containing zirconium oxide ($ZrO_2$), hafnium oxide ($HfO_2$) or silicon oxide ($SiO_2$) while containing vanadium oxide ($V_2O_5$) as a main component was adopted. Incidentally, the low-melting glass employed in this embodiment contains vanadium oxide of 22% by weight.

The vanadium contained in the low-melting glass has a function of creating the eutectic alloy layer with palladium applied on the surface of the cap body 12 to fix the light transmissive window 14 hermetically. Therefore the low-melting glass employed as the fixing material for the light transmissive window 14 must contain a considerable amount of vanadium (20% by weight or more on an oxide basis).

The vanadate-series low melting glass is employed as a fixing material for the light transmissive window 14 in the following manners. Namely, it is powder-molded in a ring-shape tablet according to the size of the light transmissive opening 12a of the cap body 12. The powder mold is set in a jig together with the cap body 12 and the light transmissive window 14. Otherwise, the vanadate-series low-melting glass is made in paste, and the paste is applied on the light transmissive window 14.

In this embodiment, a nickel plating is made on the cap body 12 as underlying plating. A palladium plating is made on the surface of the nickel plating. The nickel plating and palladium plating are made on the cap body 12 through electrolytic plating by barrel plating. Thus, palladium is applied on the entire surface of the cap body 12. Incidentally, the nickel plating has a thickness of 4 μm to 9 μm, the palladium plating has a thickness of 0.1 μm to 0.5 μm. In order to form the eutectic alloy layer necessary to fix the light transmissive window 14, the palladium plating has only to have a thickness of 0.1 μm or so.

Next, the cap body 12 is housed in a jig with a concave portion for cap housing with the opening of the cap body 12 being oriented upward. The tablet of the low-melting glass and light transmissive window 14 are stacked successively in this order within the cap body 12. Next, the jig into which the cap body 12, tablet and light transmissive window 14 are assembled is put in a heating furnace, and heated to 500° C. in a nitrogen gas atmosphere to melt the low-melting glass so that the light transmissive window 14 is fixed to the cap body 12. When the low-melting glass is molten within the heating furnace, Pd of the palladium plating made on the surface of the cap body 12 and vanadium (V) contained in the low-melting glass causes the eutectic reaction. Thus, the eutectic alloy of Pd—V is created so that the light transmissive window 14 is fixed to the cap body 12.

FIG. 2 is an enlarged schematic view of the configuration (area A in FIG. 1) in the vicinity of the interface of the fixing area between the light transmissive window 14 and the cap body 12.

Figure 2A:
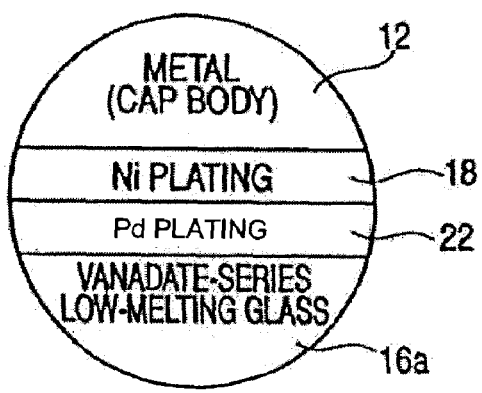
FIGS. 2A and 2B are explanation views showing the non-limiting configuration of the fixing portion of a light transmissive window.

FIG. 2A shows the status before the light transmissive window 14 is fixed. As seen from FIG. 2A, on the side of the cap body 12 a nickel plating 18 and a palladium plating 22 are formed, and vanadate-series low-melting glass 16a is arranged in contact with the palladium plating 22.

Figure 2B:
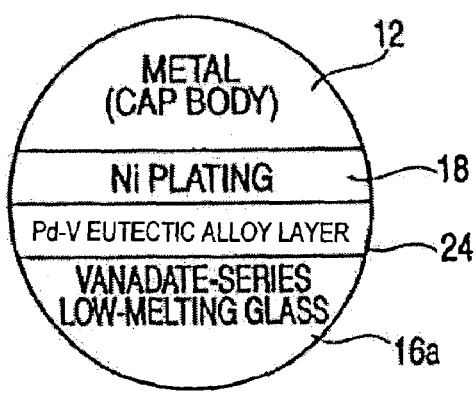

FIG. 2B shows the status after the light transmissive window 14 has been fixed. In the status where the light transmissive window 14 has been fixed, vanadium contained in the vanadate-series low-melting glass 16a and Pd in the palladium plating 22 are diffused to cause the eutectic reaction. The eutectic alloy layer 24 of Pd—V is created at the interface between the cap body 12 and low-melting glass 16a so that the light transmissive window 14 is hermetically fixed through the eutectic alloy layer 24 of Pd—V.

Evaluation tests have been carried out for the semiconductor device cap 10 fabricated as described above in terms of fixing intensity, hemeticity and humidity resistance between the light transmissive window 14 and the cap body 12. The test results are shown in the following A to C.

A. Evaluation Test on the Fixing Intensity

Table 1 shows the measurement results of (a) the load value when the light transmissive window is removed from the cap body by pressurizing the cap body so that it is sandwiched from both sides of the outer wall (trunk portion) thereof; and (b) the load value when the light transmissive window is removed from the cap body by pressurizing the light transmissive window fixed to the cap body from above. As a comparative example, shown is the test result for the semiconductor device cap manufactured by the related-art technique in which the Ni—Pb eutectic alloy layer is created to fix the light transmissive window to the cap body. In the evaluation test, 20 (twenty) samples were employed.

TABLE 1

| Load Value Pressurized Area | Embodiment Vanadate-series low-melting glass | | Comparative Example Pb-series low-melting glass | |
|---|---|---|---|---|
| | (a) Side | (b) Window | (a) Side | (b) Window |
| Maximum Value (kgf) | 7.43 | 0.93 | 7.78 | 1.24 |
| Minimum Value (kgf) | 5.72 | 0.71 | 5.70 | 1.09 |
| Average Value (kgf) | 6.84 | 0.89 | 7.03 | 1.16 |

Where the light transmissive window 14 is strongly fixed to the cap body 12, the load value exhibits a larger value. The test result in Table 1 shows that the semiconductor device cap according to this embodiment in which the vanadate-series low-melting glass is used as the fixing material has a fixing strength approximately equal to the related-art semiconductor device cap in which the Pb-series low-melting glass is employed, and thus the semiconductor device cap according to this embodiment can be put into practical use.

Incidentally, where the light transmissive window 14 is fixed to the cap body 12 using the vanadate-series low-melting glass having the above composition as the fixing material, without applying the metal such as palladium causing the eutectic reaction with vanadium on the surface of the cap body 12, for example, only with the nickel plating made on the surface of the cap body 12, if the light transmissive window 14 is fixed, the eutectic alloy layer is not created at the interface between the cap body 12 and low-melting glass. Thus, when external force is acted on the light transmissive window 14 in the fixed status, the light transmissive window 14 easily comes off so that the completed semiconductor device cap cannot be put into practice.

B. Evaluation on Hermiticity

A leakage test using a helium detector was carried out for samples of the above semiconductor device cap by performing a thermal shock operation and temperature cycle operation. The table 2 shows the test result. 20 (twenty) samples were employed. The test result in Table 2 shows that the leakage does not occur at the fixing portion between the light transmissive window and cap body of the semiconductor device cap, and hemiticity satisfactory for practical use is also obtained.

TABLE 2

| Test Contents | Thermal Shock Test | Temperature Cycle Test |
|---|---|---|
| Test Condition | −65° C./150° C. 100 cycles | −65° C. −150° C. 300 cycles |
| Test Result | No NG | No NG |

C. Evaluation Test on Humidity Resistance

A PCT test (pressure cooker test) was carried out in which a sample is exposed for 48 hours under the condition of a temperature of 120° C., pressure of 2 atmospheres and humidity of 100%. Presence or absence of pore condensation was tested for 20 samples. No pore condensation was detected.

Further, after the semiconductor device cap had been welded to a metallic stem, it was exposed for 1000 hours within a thermo-hygrostat bath (85° C. and humidity of 85%) to perform the test of detecting the presence or absence of the pore condensation. As a result, the pore condensation was not detected for all of 20 samples.

This humidity resistance test result shows that the semiconductor device cap according to this embodiment can be sufficiently put into practice.

Incidentally, the above evaluation test was carried out for the semiconductor device cap using the low-melting glass containing vanadium oxide of 22% by weight as the fixing material. But for the semiconductor device cap using the low-melting glass containing vanadium oxide of 26% by weight also, a similarly satisfactory result was obtained.

Embodiment 2

As described above, where the vanadate-series low-melting glass is employed as the fixing material for fixing the light transmissive window 14 to the cap body 12, a gold plating, in place of the palladium plating, may be made on the surface of the cap body 12 so that through the eutectic alloy layer of gold and vanadium contained in the low-melting glass, the light transmissive window 14 can be fixed to the cap body 12. The semiconductor device cap according to the second embodiment is a semiconductor device cap manufactured through the gold plating made on the surface of the cap body 12.

Figure 3A:
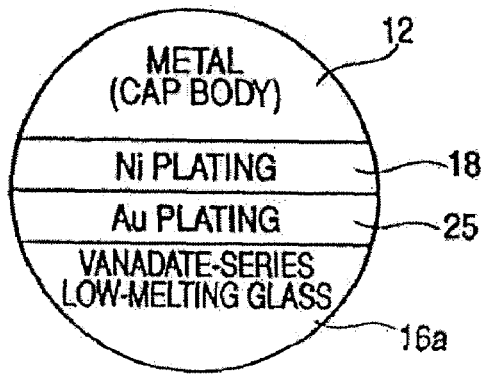
FIGS. 3A and 3B are explanation views showing another non-limiting configuration of the fixing portion of a light transmissive window.
Figure 3B:
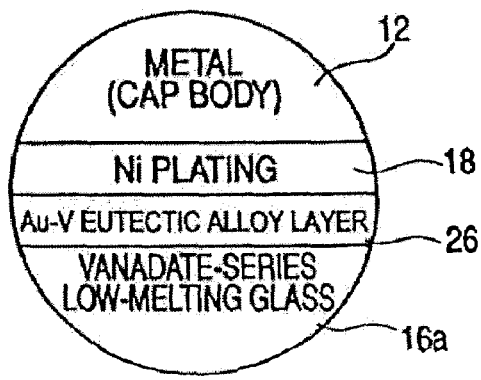
Figure 4:
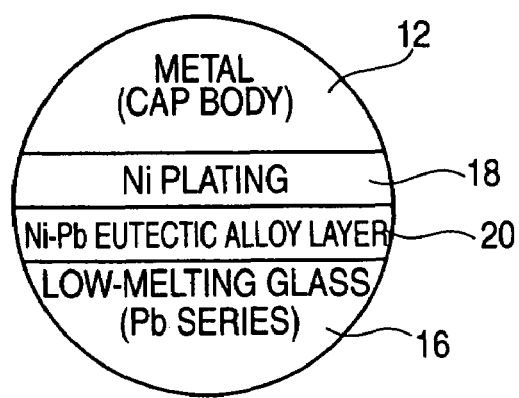
FIG. 4 is an explanation view showing a related-art configuration of the fixing portion of a light transmissive window.
Figure 5:
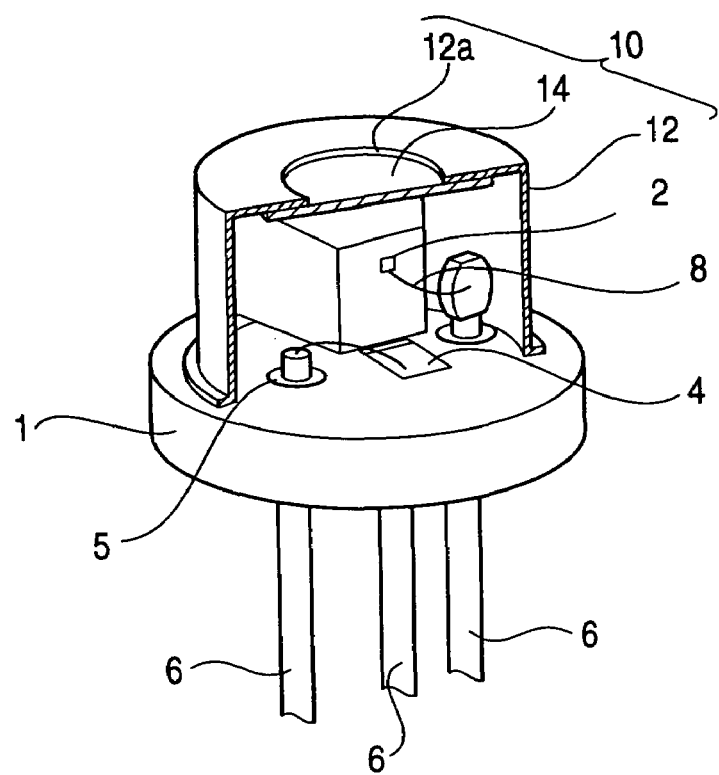
FIG. 5 is an explanation view showing a related-art configuration of a semiconductor laser device.

FIG. 3 is an enlarged schematic view of the configuration (area A in FIG. 1) in the vicinity of the interface of the fixing area where the light transmissive window 14 is fixed to the cap body 12 with the gold plating 25 made on its surface using the vanadate series low-melting glass 16a. FIG. 3A shows the status before fixing and FIG. 3B shows the status after fixing.

The cap body 12 is subjected to the nickel plating having a thickness of 4 μm to 9 μm as an underlying plating, and further to a gold plating 25 having a thickness of 0.1 μm to 0.5 μm.

As seen from FIG. 3B, a tablet of the vanadate-series low-melting glass and light transmissive window 14 are set in the gold-plated cap body 12 and heated within a heating furnace at 500° C. Thus, an Au—V eutectic alloy layer 26 is created at the interface between the low-melting glass 16a and the cap body 12 so that the light transmissive window 14 is hermetically fixed to the cap body 12 through the Au—V eutectic alloy layer 26.

The same evaluation test as that for the product with the palladium plating made on the surface of the cap body 12 described above was carried out for the semiconductor device cap manufactured by making the gold plating 25 on the cap body 12 and using the vanadate-series low-melting glass as the fixing material. As a result, it was confirmed that similar hermeticiy and humidity resistance can be obtained for the cases where the fixing material contains vanadium of 22% by weight and of 26% by weight. Namely, the semiconductor device cap according to this embodiment can be also provided as a product which can be sufficiently put into practice.

In the above semiconductor device cap with the palladium plating 22 made on the surface of the cap body 12, by making the palladium plating 22, the surface of the cap body 12 becomes coarse and assumes dark color with no gloss, thereby giving the function of suppressing light reflection inside the cap. On the other hand, in the case of the semiconductor device cap with the gold plating 25 made on the surface of the cap body 12, the gloss of the surface of the cap body 12 becomes higher than in the case of the palladium plating 22.

Additionally, by making coarse the surface of the nickel plating 18 made as the underlying plating for the palladium plating 22 or the gold plating 25, the light transmissive window 14 can be fixed to the cap body more strongly. This may be attributable to the fact that the surface of the nickel plating 18 becomes coarse so that through an added anchoring function, the light transmissive window 14 is fixed to the cap body 12. In order that the surface of the plating is made coarse, techniques of chemically etching the plating surface after plating and of performing a physical operation such as sandblast on the plating surface can be adopted. The underlying plating has a thickness of 4 μm to 9 μm. The outer surface of the plating when the surface of the underlying plating is made coarse has a grain size of 0.5 μm to 1.0 μm.

In the above embodiments the explanation was given of the semiconductor device cap having the structure in which the light transmissive window 14 is fixed to the inside of the cap body 12. However, the light transmissive window 14 may be arranged on the outside (upper surface) of the cap body 12 so that it covers the light transmissive opening 12a.

Further, the semiconductor device cap according to this invention can be applied to not only the semiconductor laser device with the semiconductor laser element loaded but also to a general semiconductor device provided with an light transmissive window.

As understood from the description hitherto made, the semiconductor device cap according to this invention uses the leadless vanadate-series low-melting glass as the fixing material for fixing the light transmissive window 14 to the cap body 12 so that no containment of lead is realized in a manufacturing process of the semiconductor device cap. Further, by creating the eutectic alloy layer of vanadium contained in the low-melting glass and the palladium or gold applied by plating on the surface of the cap body so that the light transmissive window 14 is fixed to the cap body 12 through the eutectic alloy layer, the light transmissive window 14 is hermetically fixed to the cap body 12. Thus, the semiconductor device cap according to this invention can be provided as a semiconductor device cap with excellent humidity resistance and hermeticity as compared with a related-art semiconductor device cap in which leadless glass such as $SnO-P_2O_5$ series glass is simply employed.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

I claim:

1. A cap for a semiconductor device comprising:
   a cap body provided with a light transmissive opening; and
   a light transmissive member fixed to the cap body using low-melting glass as a fixing material so that the light transmissive member covers the light transmissive opening,
   wherein said light transmissive member is fixed to said cap body through an eutectic alloy layer formed by an eutectic reaction of vanadium (V) contained in said low-melting glass and metal applied on a surface of said cap body.

2. The cap of claim 1 wherein the cap is hermetically sealed.

3. A semiconductor device comprising the cap of claim 1.

4. The cap of claim 1, wherein the cap does not contain lead.

5. The cap of claim 1, wherein the cap body comprises at least one metal selected from the group consisting of iron, nickel, copper, cobalt, and alloys thereof.

6. The cap of claim 1 wherein the low-melting glass further comprises one selected from the group consisting of hafnium oxide and silicon oxide.

7. A laser comprising the cap of claim 1.

8. A cap for a semiconductor device according to claim 1, wherein
   the metal applied on the surface of the cap body is palladium (Pd), and
   said light transmissive member is fixed to said cap body through an eutectic alloy layer formed by the eutectic reaction of vanadium (V) contained in said low-melting glass and palladium (Pd) applied on the surface of said cap body.

9. The cap of claim 8 wherein the cap is hermetically sealed.

10. A semiconductor device comprising the cap of claim 8.

11. The cap of claim 8, wherein the cap does not contain lead.

12. The cap of claim 8, wherein the cap body comprises at least one metal selected from the group consisting of iron, nickel, copper, cobalt, and alloys thereof.

13. The cap of claim 8 wherein the low-melting glass further comprises one selected from the group consisting of hafnium oxide and silicon oxide.

14. A cap for a semiconductor device according to claim 1, wherein the metal applied on the surface of the cap body is gold (Au), and said light transmissive member is fixed to said cap body through an eutectic alloy layer formed by the eutectic reaction of vanadium (V) contained in said low-melting glass and gold (Au) applied on the surface of said cap body.

15. The cap of claim 14 wherein the cap is hermetically sealed.

16. A semiconductor device comprising the cap of claim 14.

17. The cap of claim 14, wherein the cap body comprises at least one metal selected from the group consisting of iron, nickel, copper, cobalt, and alloys thereof.

18. The cap of claim 14 wherein the low-melting glass further comprises one selected from the group consisting of hafnium oxide and silicon oxide.

19. The cap of claim 14, wherein the cap does not contain lead.

20. A laser comprising the cap of claim 19.

* * * * *